(12) United States Patent
Ishii et al.

(10) Patent No.: US 7,192,790 B2
(45) Date of Patent: Mar. 20, 2007

(54) MANUFACTURING METHOD FOR A SEMICONDUCTOR DEVICE

(75) Inventors: Kazutoshi Ishii, Chiba (JP); Jun Osanai, Chiba (JP); Yuichiro Kitajima, Chiba (JP); Yukimasa Minami, Chiba (JP); Keisuke Uemura, Chiba (JP); Miwa Wake, Chiba (JP)

(73) Assignee: Seiko Instruments Inc. (JP)

( * ) Notice: Subject to any disclaimer, the term of this patent is extended or adjusted under 35 U.S.C. 154(b) by 212 days.

(21) Appl. No.: 10/936,009

(22) Filed: Sep. 8, 2004

(65) Prior Publication Data

US 2005/0124081 A1  Jun. 9, 2005

(30) Foreign Application Priority Data

| Sep. 9, 2003 | (JP) | 2003-316588 |
| Sep. 9, 2003 | (JP) | 2003-316589 |
| Sep. 9, 2003 | (JP) | 2003-316590 |
| Sep. 9, 2003 | (JP) | 2003-316591 |
| Sep. 7, 2004 | (JP) | 2004-259653 |

(51) Int. Cl.
  *H01L 21/66* (2006.01)
(52) U.S. Cl. .......................... 438/11; 438/18
(58) Field of Classification Search .............. 438/5, 438/11, 18
  See application file for complete search history.

(56) References Cited

U.S. PATENT DOCUMENTS

| 5,753,556 | A | * | 5/1998 | Katada et al. ............... 438/302 |
| 6,258,613 | B1 | * | 7/2001 | Iwamatsu ..................... 438/18 |
| 6,304,999 | B1 | * | 10/2001 | Toprac et al. ................... 716/4 |
| 6,551,847 | B2 | * | 4/2003 | Asahina et al. ............... 438/18 |
| 6,593,154 | B2 | * | 7/2003 | Marume et al. .............. 438/14 |
| 6,618,120 | B2 | * | 9/2003 | Ueta ............................ 355/72 |
| 6,785,583 | B2 | * | 8/2004 | Oishi et al. .................. 700/108 |
| 2002/0107660 | A1 | * | 8/2002 | Nikoonahad et al. ........ 702/155 |
| 2002/0182757 | A1 | * | 12/2002 | Conchieri et al. ............. 438/7 |
| 2003/0082837 | A1 | * | 5/2003 | Pasadyn et al. .............. 438/14 |
| 2004/0051148 | A1 | * | 3/2004 | Johnson et al. ............. 257/378 |
| 2004/0083021 | A1 | * | 4/2004 | Somekh et al. ............. 700/121 |
| 2004/0102857 | A1 | * | 5/2004 | Markle et al. ................. 700/2 |

OTHER PUBLICATIONS

Sischka, Frank; Characterization Handbook; Oct. 11, 2003; Agilent, http://eesof.tm.agilent.com/docs/iccap2002/MDLGBOOK/1MEASUREMENTS/2CV/CV.pdf.*

* cited by examiner

*Primary Examiner*—Chandra Chaudhari
(74) *Attorney, Agent, or Firm*—Adam & Wilks

(57) ABSTRACT

A manufacturing method for a semiconductor device which is capable of manufacturing the semiconductor device with a high quality in high yields while reducing variations in electric characteristic is disclosed. The manufacturing method according to the present invention includes a main body wafer manufacturing process for manufacturing a wafer on which a semiconductor device to be completed as a product is formed and a monitor wafer manufacturing process for manufacturing a wafer on which a monitor element is formed, the processes sharing a monitoring step alone, the main body wafer manufacturing process including a variation reduction step, the monitor wafer manufacturing process including a quality check step and a condition setting step.

20 Claims, 15 Drawing Sheets

MANUFACTURING METHOD FOR A SEMICONDUCTOR DEVICE

BACKGROUND OF THE INVENTION

1. Field of the Invention

The present invention relates to a manufacturing method for a semiconductor device. In particular, the invention relates to a manufacturing method for a semiconductor device including a method of monitoring halfway through a manufacturing process of the semiconductor device and a method of reflecting monitoring information to its subsequent manufacturing process.

2. Description of the Related Art

Upon manufacturing any products, product-to-product variation (production variation) impairs uniformity in product characteristics (inclusive of function, performance, and shape). To prevent it, a manufacturer faces an agonizing choice between relaxing a production specification to keep a production yield at a certain level (decrease in quality) and complying with a product specification to thereby cause reduction in production yield (increase in cost). Under such circumstances, regarding a manufacturing method for a semiconductor device as a typical method for mass-production of goods as well, some improvement have been made and tried on a manufacturing method by combining a cost-oriented manufacturing method with a quality-oriented manufacturing method. Prior to explanation about the improved manufacturing method, generally-employed manufacturing methods for a semiconductor device are first described.

A semiconductor device is provided in a form of a semiconductor chip (for example, 0.5 mm in thickness, 10 mm in length, 8 mm in width) on which a number of electronic elements such as transistors, resistors, capacitors, diodes and wirings for electrically connecting the electronic elements together are formed, and the chip is housed in a package according to the environment it is actually used. The packaged chip is incorporated into an electronic device such as a computer, a mobile telephone, a game console, etc., for variety of use. A manufacturing process for semiconductor device consists of, as shown in a macro-manufacturing process flow of FIG. 2, a pre-manufacturing process X for lot-production of several dozens of wafers on which a number of semiconductor chips are assigned and a post-manufacturing process Y for separating the semiconductor chips assigned on the wafers from one another to be housed in packages and subjected to product testing. The post-manufacturing process Y hence includes package assembly and product testing. Electric characteristics of a semiconductor device are nearly determined at the time of placing the semiconductor chip on a wafer, in other words, upon the completion of the pre-manufacturing process X although there are a few exceptions, i.e., FPLD (digital IC), fuse memory, and such other semiconductor devices whose functions are determined by a user after the completion of the post-manufacturing process Y. It is assumed throughout the following description that characteristic variation due to the post-manufacturing process Y is negligible. In this specification, description of the manufacturing process for the semiconductor device is therefore exclusively focused on the pre-manufacturing process X. Description of the post-manufacturing process Y will accordingly be omitted hereafter.

Here, the pre-manufacturing process X for the semiconductor device will be described with reference to a typical and simplified manufacturing process flow of FIG. 3 in which basic processes are shown. A semiconductor device manufactured by utilizing these processes is also called a CMOS semiconductor device. As is well known CMOS semiconductor device occupies large portion of total semiconductor device production.

1. Field Oxide Film Formation

Insulating films partially different in thickness are selectively formed near the surfaces of a semiconductor substrate, in this example a P-type semiconductor substrate, through thermal oxidation etc. (FIG. 3, Step J).

2. N Well Formation

Phosphorous ions for N well formation are selectively implanted into the semiconductor substrate surface, for example, to thereby form an N well (FIG. 3, Step K).

3. Isolation with LOCOS $BF_2$ ions for P-type channel stopper formation are selectively implanted into the P-type semiconductor substrate surface and its vicinities, for example, after which an element isolation insulating film and channel stopper are selectively formed by using a LOCOS method etc. (FIG. 3, Step L).

4. Channel Doping

Phosphorous ions for controlling a threshold voltage are selectively implanted into the semiconductor substrate surface in an active region for element formation where a transistor is formed later to thereby form an impurity doped region (FIG. 3, Step M).

5. Gate Oxide Film Formation

An oxide film near the semiconductor substrate surface in the active region for element formation is removed to form a gate oxide film through thermal oxidation etc. (FIG. 3, Step N).

6. Polysilicon Gate Formation

A poly-crystalline silicon (polysilicon) gate is selectively formed on the gate oxide film through chemical vapor deposition (CVD), photolithography, and etching (FIG. 3, Step O).

7. Source/drain Formation

After an oxide film is formed on the P-type semiconductor substrate surface by CVD or thermal oxidation, impurity ions for forming source/drain (SD) regions are implanted to the polysilicon gate and the oxide film in desired regions of the active region for the element formation in a self-alignment manner to thereby form an N-type source region, an N-type drain region, a P-type source region, and a P-type drain region (FIG. 3, Step P).

8. Interlayer Insulating Film Formation

An oxide film is deposited on the P-type semiconductor substrate surface by CVD or the like to thereby form an interlayer insulating film (FIG. 3, Step Q).

9. Contact Hole Formation

A contact hole is selectively formed onto an interlayer insulating film through photolithography and etching (FIG. 3, Step R).

10. Metal Wiring Formation

A metal wiring is selectively formed on the interlayer insulating film through sputtering, photolithography, etching, etc. (FIG. 3, Step S).

11. Protective Film

A protective film is deposited on the metal wiring and an opening is selectively formed in a desired region (metal wiring in an external connection terminal region etc.) (FIG. 3, Step T).

12. Wafer Inspection

A semiconductor chip and an IC tester are electrically connected through a wafer prober to test electric characteristics etc. of the semiconductor device (FIG. 3, Step U).

As mentioned above, the semiconductor device is manufactured through a long-term manufacturing process. Looking closer, the manufacturing process is very complicated and consists of well over 100 steps. The electric characteristics of the semiconductor device are determined depending on characteristics of circuit elements in the semiconductor chip. As well known in the art, the electric characteristic of a MOS transistor, which is a typical circuit element of the semiconductor device, is approximately represented by the following equation (1) for unsaturated state:

$$Id = \mu C (W/L)(Vg - Vt)Vd \tag{1}$$

where

Id: drain current of a transistor
$\mu$: carrier mobility of the transistor
C: gate capacitance per unit area of the transistor
W: gate width of the transistor
L: gate length of the transistor
Vg: gate-source voltage of the transistor
Vd: drain-source voltage of the transistor
Vt: threshold voltage of the transistor As apparent from the equation (1), the current characteristics of the transistor are determined by many characteristic parameters. Further, the threshold voltage Vt is derived from the following equation (2):

$$Vt = V_F + 2 \cdot _F + (Q_A + Q_B)/C \tag{2}$$

where $V_F$: flat band voltage
$_F$: shift in Fermi level due to impurity
$Q_A$: interface charge per unit area at an interface between the oxide film and the silicon surface
$Q_B$: charge per unit area of a depletion layer
C: gate capacitance per unit area of the transistor The electric characteristics of the transistor manufactured through the manufacturing process including well over 100 steps may vary due to an influence of the long-term manufacturing process. In commercializing a semiconductor device, a product specification is determined by balancing the quality with the cost while taking the variations into account, and a circuit is designed such that the electric characteristics of the semiconductor device comply with the product specification. In some cases, however, high quality, e.g., high precision, should precede the cost as a result of reflecting the strong demand from the market. The characteristic parameter sensitive to the variations in electric characteristics, such as the threshold voltage Vt may largely vary between wafers, among the same lot, and in the same semiconductor chip as well as between lots. Heretofore, there is an increasing demand for realization of a manufacturing method which absorbs and lowers the variations of parameters having a large contribution to the variation in electric characteristics of the semiconductor device, such as the threshold voltage Vt.

Up to now, a manufacturing method for a semiconductor device has been proposed, with which the aforementioned problem is solved and the variations in the threshold voltage Vt are reduced. The manufacturing method is completed by adding, for example, a step of reducing variations of FIG. 14, to the typical manufacturing process flow of FIG. 2. The step of reducing the variations includes a quality check step F of measuring and checking a quality of a half-completed product in the middle of the manufacturing process, a condition setting step G of setting a manufacturing condition in a variation reduction step H included in the subsequent manufacturing process for the semiconductor device, based on the measurement information, and the variation reduction step H of absorbing and reducing the variations in electric characteristics under the set manufacturing condition for manufacturing the semiconductor device. The above three steps are regarded as being extended from the wafer inspection step (FIG. 3, Step U).

A first prior art aiming to solve the aforementioned problem provides a feed-back type manufacturing method including: measuring (or simulating) the threshold voltage Vt of an electronic element in a half-completed semiconductor chip during manufacture under existing manufacturing conditions; adjusting and determining the next manufacturing conditions for manufacturing the next lot based on the existing manufacturing conditions for the semiconductor device and the measurements; reducing variations in the threshold voltage Vt of the semiconductor device; and reducing variations in electric characteristics (see JP 2002-083958 A (p. 8, FIG. 1), for example). A second prior art aiming to solve the aforementioned problem provides a trimming type manufacturing method including: adjusting values (e.g., resistance value) of passive elements in a half-completed semiconductor chip; absorbing variations in the threshold voltage Vt etc. for each chip; and reducing variations in electric characteristics of a semiconductor device (see JP 07-086521 A (p. 5, FIG. 1), for example). These prior arts will be described in brief below, but detailed description will be referred to each publication.

The feed-back type manufacturing method as the conventional manufacturing method for the semiconductor device aimed to reduce production variations is a method of setting the next manufacturing condition based on the existing manufacturing condition of the manufacturing process in the case of manufacturing another semiconductor device. More specifically, it is a manufacturing method including: measuring the threshold voltage Vt of a semiconductor product manufactured under the existing manufacturing condition; measuring or evaluating a quality of the semiconductor device in course of manufacture (FIG. 15, Step F) and then revising and determining the next manufacturing condition based on the existing criteria (FIG. 15, Step G); and manufacturing the next semiconductor device under the next manufacturing condition (FIG. 15, Step H) to reduce the variations in electric characteristics of the semiconductor device. According to this feed-back type manufacturing method, the next manufacturing condition is adjusted based on information on current variations to thereby reduce the variations in electric characteristics of the semiconductor device. A specific method of determining the next manufacturing condition is shown in FIG. 15.

The trimming type manufacturing method as another typical manufacturing method for a semiconductor device aimed to reduce the production variation uses a trimming circuit as shown in FIG. 18. In the trimming circuit of FIG. 18, resistors 220 and 221 are electrically connected in series between external input terminals 300, and 301. Fuses 230 and 231 are connected to the resistors 220 and 221 in parallel, respectively. A gate electrode of a transistor 210 is connected to a node between the resistors 220 and 221. A drain region of the transistor 210 is connected to an external input/output terminal 303 through an internal circuit 240 while a source region thereof is connected to an external input/output terminal 304 through an internal circuit 241. The fuses 230 and 231 of the trimming circuit of this semiconductor device are formed of polysilicon but may be formed of aluminum etc. as a metal thin film. Note that, pairs of the resistors 220, 221 and of the fuses 230, 231 may be provided in plural as needed.

The trimming type manufacturing method includes: measuring and checking the quality of the half-completed semiconductor device midway through the manufacturing process (FIG. 16, Step F); and determining fuse cutout portions in the trimming circuit so as to absorb variations of individual semiconductor chips (FIG. 16, Step G and trimming the individual semiconductor chips (FIG. 16, Step H) to thereby reduce the variations in electric characteristics of the semiconductor device.

However, the conventional manufacturing methods involve the following problems. With the feed-back type manufacturing method as the prior art of FIG. 15, initial conditions for new manufacturing process are first set by, for example, analogizing and referring from to the existing manufacturing process (existing technique) and then a product is manufactured by way of trial or simulation through all the steps under the initial manufacturing conditions. Next, the quality is measured and checked, after which the initial manufacturing conditions are revised based on the preset criteria to determine the next manufacturing conditions. Thus, the quality check step F and the manufacturing condition setting step G cannot be applied to the semiconductor device in course of manufacture. The wafer inspection result of the completed semiconductor device can be fed back for improving the next manufacturing conditions to thereby improve the manufacturing process. However, this is not directly contributable to reduction in variations of the semiconductor device in course of manufacture.

With the trimming type manufacturing method as the prior art of FIG. 16, the half-completed semiconductor device itself is measured midway through the manufacturing process, and hence the quality check step F and the manufacturing condition setting step G can be applied to the semiconductor device in course of manufacture. However, in this method, quality damage is caused on the semiconductor device at the time of measurement (due to the contact type measurement in most cases) or a trimming circuit is provided in the semiconductor device for reflecting measurements therein in advance. As a result, this redundant circuit leads to an increase of chip area of the semiconductor device, resulting in lowering of mass-production efficiency and final increase in cost.

SUMMARY OF THE INVENTION

The present invention has an object to provide a manufacturing method for a semiconductor device, which enables reduction in variation of a half-completed semiconductor device without increasing a chip area of the semiconductor device.

A manufacturing method for a semiconductor device according to the present invention includes: a pre-manufacturing process X for manufacturing wafer (hereinafter, referred to as "main body wafer") where the semiconductor device to be completed as a product is formed; and a monitor wafer manufacturing process (FIG. 1, Step Z) for manufacturing a wafer (hereinafter, referred to as "monitor wafer") where a monitor element 200 is formed, in which the main body wafer manufacturing process X and the monitor wafer manufacturing process Z share a monitoring step (FIG. 1, Step C) of copying a quality of the semiconductor device on the monitor element 200, the main body wafer manufacturing process X includes a variation reduction step (FIG. 1, Step H) after the monitoring step C, and the monitor wafer manufacturing process Z includes a quality check step (FIG. 1, Step F) of measuring characteristics of the monitor element 200 after the monitoring step C and its subsequent condition setting step (FIG. 1, Step G) of setting a manufacturing condition in the variation reduction step H based on measurement information. The aforementioned manufacturing method for a semiconductor device is now referred to as a "feed-forward manufacturing method" herein.

An embodiment of the present invention will be described in detail later. To explain it in brief, as shown in FIG. 1, variations of the semiconductor device are copied to the monitor element 200 (FIG. 4) in course of manufacture (FIG. 1, Step C), a quality of the half-completed semiconductor device is checked (FIG. 1, Step F), a quality of the completed semiconductor device is estimated based on the measured information (FIG. 1, Step G1), the manufacturing conditions of a variation reduction step in the subsequent manufacturing process are set in an analog fashion based on the estimated information (FIG. 1, Step G2), and the variations in electric characteristics are reduced under the newly set manufacturing conditions to complete the manufacture of the semiconductor device (FIG. 1, Step H). Variations in electric characteristics of the semiconductor device in course of manufacture can thus be reduced considerably. In other words, according to the present invention, the variations of the semiconductor device can be reduced without causing any quality damage on the semiconductor device to be completed as a product and also without requiring any redundant circuit.

Further, forming the monitor element 200 on which the quality of the semiconductor device is copied in an amplifying manner on a monitor wafer and utilizing it, monitoring can be performed in a short time at low costs to thereby obtain measurement information sufficient in terms of both quality and quantity since the monitor wafer is only subjected to a short-term process unlike the main body wafer which is subjected to a long-term process. Thus, the manufacturing conditions for the quality check step F can be made more precisely. The feed-forward manufacturing method of the present invention accordingly enables a further reduction in variations in electric characteristics of the semiconductor device and realizes a manufacturing method for a semiconductor device capable of manufacturing the semiconductor device with high quality in high yields.

DETAILED DESCRIPTION OF THE PREFERRED EMBODIMENTS

Figure 1:
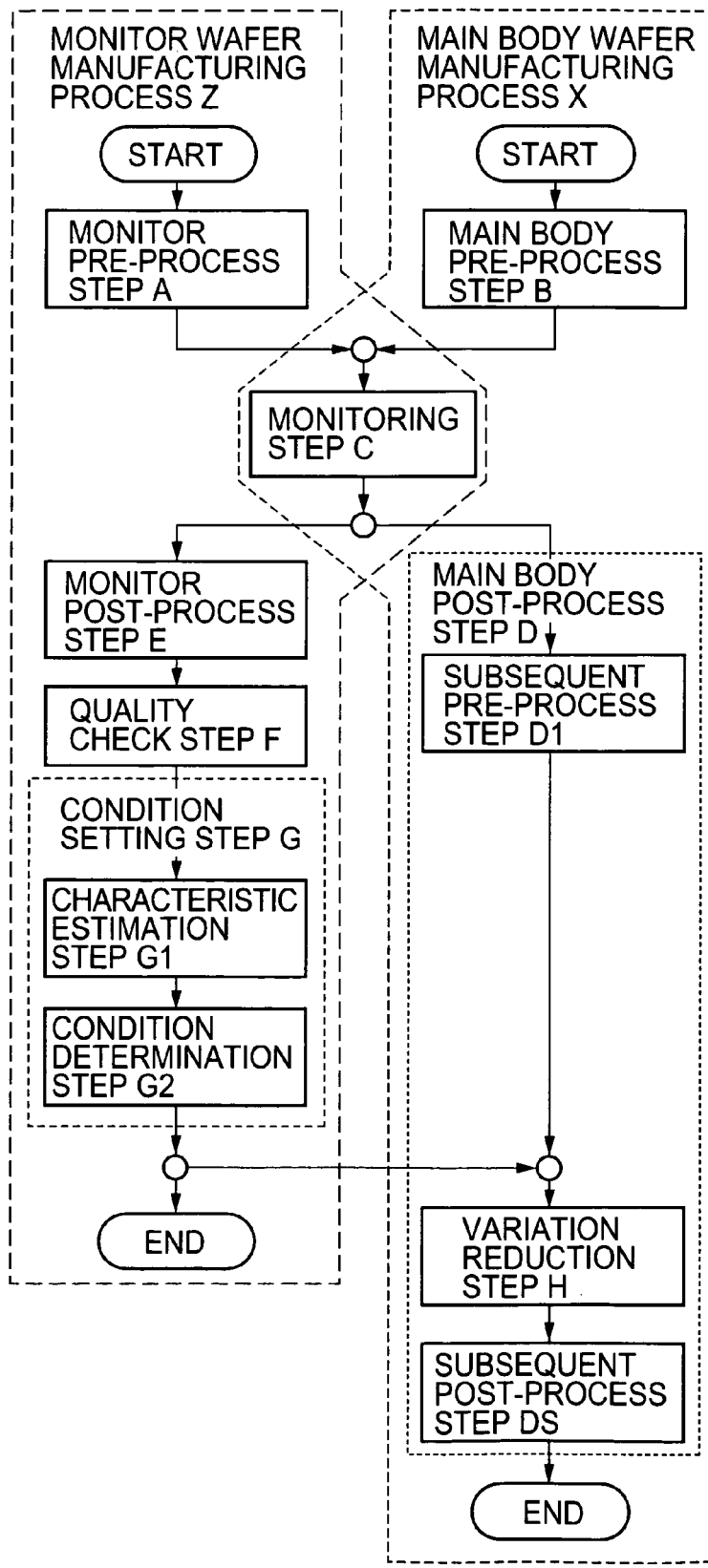
FIG. 1 is a conceptual view illustrative of a manufacturing process flow of a feed-forward manufacturing method according to the present invention.
Figure 2:
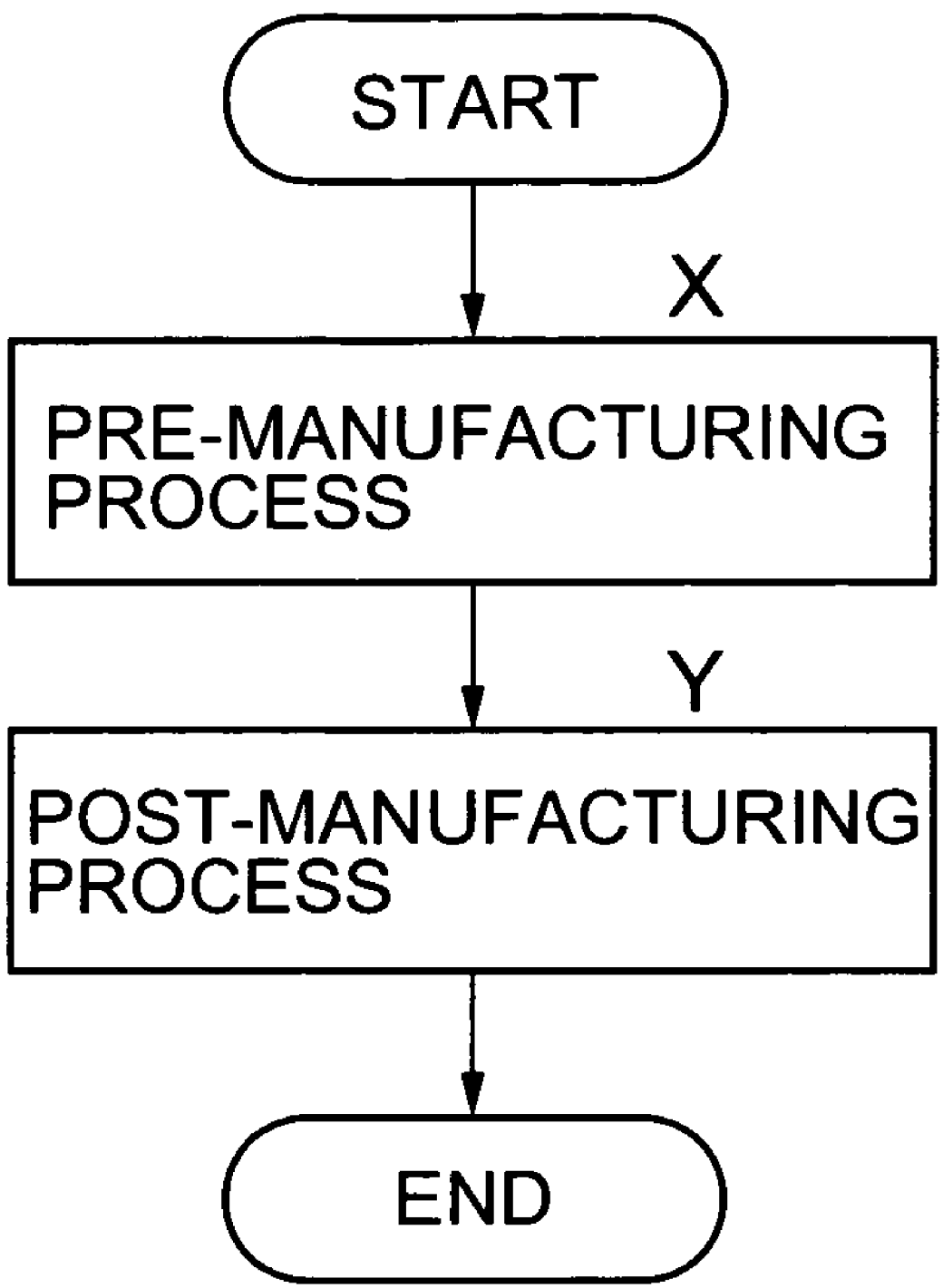
FIG. 2 is a flowchart of a typical macro-manufacturing process flow for a semiconductor device.
Figure 4:
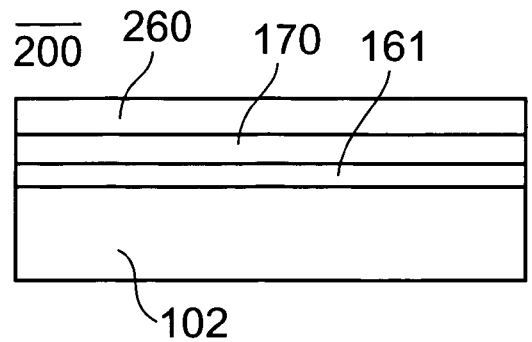
FIG. 4 is a schematic diagram showing a monitor element 200 used in an embodiment of the present invention.

FIG. 1 is a conceptual view illustrative of a manufacturing process flow of a manufacturing method for a semiconductor device according to the present invention. A manufacturing method according to an embodiment of the present invention includes: a main body wafer manufacturing process X for manufacturing a wafer where the semiconductor device is to be completed as a product is formed; and a monitor wafer manufacturing process Z for manufacturing a wafer where a monitor element 200 which is shown in FIG. 4 is formed (hereinafter, referred to as "monitor wafer"). The main body wafer manufacturing process X and the monitor wafer manufacturing process Z share a monitoring step C alone. The monitoring step C is important as a step of copying on the monitor element 200 formed on the monitor wafer, a quality of the semiconductor device formed on the main body wafer.

Figure 3:
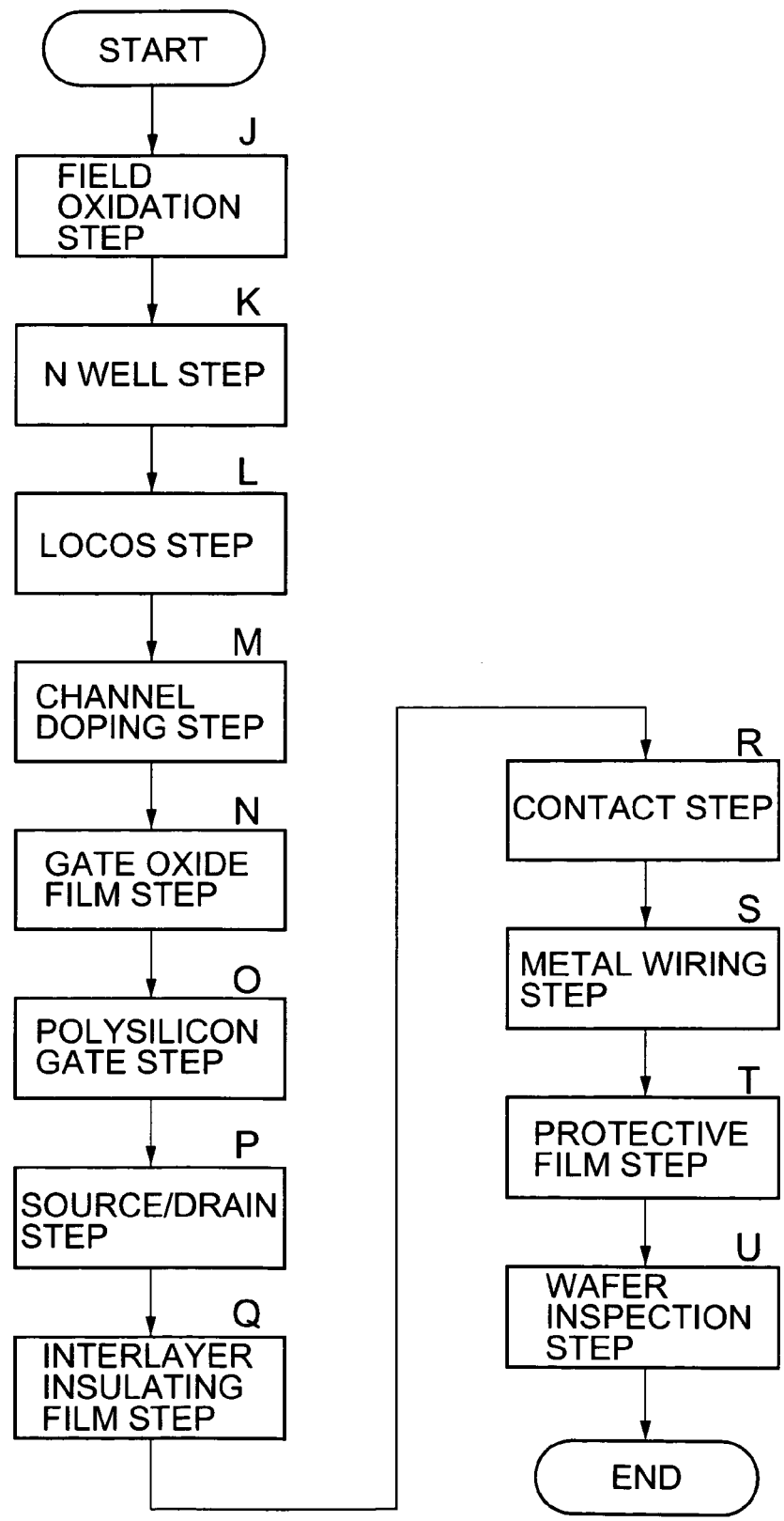
FIG. 3 is a flowchart of a typical manufacturing process flow of a pre-manufacturing process of a manufacturing method for a semiconductor device.

A manufacturing process flow (FIG. 3) is basically applied to the main body wafer manufacturing process X. The monitoring step C of FIG. 1 is selected from the manufacturing process flow of FIG. 3 as needed. As the monitoring step C, plural steps may be selected. It is assumed here that steps preceding a step specified as the monitoring step C, for example, a gate oxide film formation step N are each referred to as a "main body pre-process step" B while steps in a manufacturing process succeeding the monitoring step C are each referred to as a "main body post-process step" D. The main body post-process step D includes a variation reduction step H. As the variation reduction step H, plural steps may be set corresponding to the monitoring step C as needed. Steps are selected from the manufacturing process flow of FIG. 3 as a subsequent pre-process step D1 and a subsequent post-process step D2 upstream and downstream of the variation reduction step H, respectively, as needed.

The pre-manufacturing process X for the semiconductor device applied in the embodiment of the present invention will be described in detail with reference to step-order sectional views (FIGS. 5 to 13, and 19). The embodiment of the present invention is not limited to the step-order sectional views but is applicable to any pre-manufacturing process for a typical semiconductor device. Needless to say, the present invention is not limited to a manufacturing method for a MOS semiconductor device but is applicable to a manufacturing method for a bipolar semiconductor device, compound semiconductor, or the like.

1. Field Oxide Film

Figure 5:
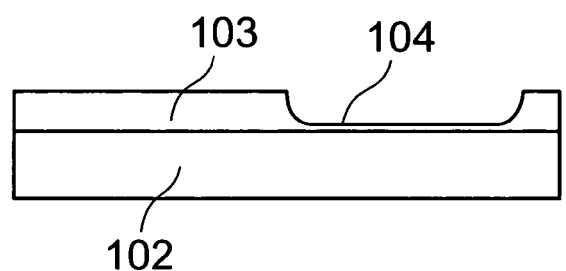
FIG. 5 is a sectional view illustrative of a typical manufacturing method for a semiconductor device used in an embodiment of the present invention in the step order.

Insulating films partially different in thickness are selectively formed near the surface of a semiconductor substrate, for example, a P-type semiconductor substrate 102 through thermal oxidation etc. to thereby form an oxide film 103 having a thickness of about 300 to 1,000 nm and an oxide film 104 having a thickness of about 50 to 100 nm. Here, the P-type semiconductor substrate is used but an N-type semiconductor substrate can be used as well (FIG. 5).

2. N Well

Figure 6:
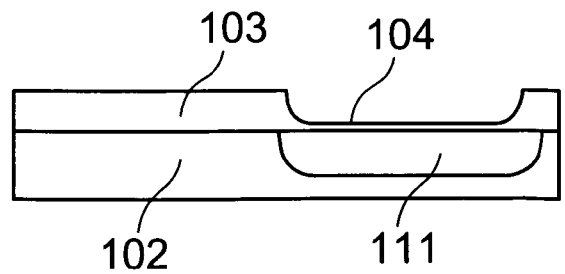
FIG. 6 is a sectional view illustrative of a typical manufacturing method for a semiconductor device used in an embodiment of the present invention in the step order.

Impurity ions, for example, phosphorous ions are implanted into the main body wafer surface in an impurity amount of about $3.0 \times 10^{12}/cm^2$ to thereby form an impurity doped region for forming an N well 111. This step is called a well impurity doping step. Next, impurities doped into the main body wafer through ion implantation are electrically inactive unless otherwise treated and thus subjected to activation through heat treatment and recovered from damage upon ion implantation. In order to form a PMOS transistor inside the N well 111, the N well 111 needs to have some depth. Typically, the requisite depth is about 1 to 3 mm for the miniaturized transistor and about 3 to 8 mm for the high-breakdown voltage transistor. To obtain an impurity profile necessary for the heat treatment, thermal diffusion is carried out under the conditions of 1,100 to 1,200° C. for several to over ten hours with an electric furnace, for example. This is called a "well thermal diffusion step" (FIG. 6). The well thermal diffusion step is such that plural (about 150) large-diameter wafers are simultaneously processed at high temperature for a long time. Here, the N well 111 is used, but a P well or both the N well and the P well can be used.

3. LOCOS

Figure 7:
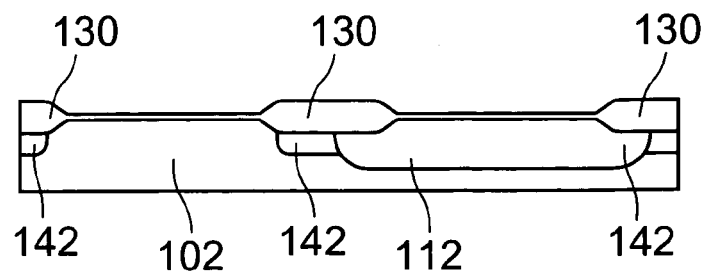
FIG. 7 is a sectional illustrative of a typical manufacturing method for a semiconductor device used in an embodiment of the present invention in the step order.

B or $BF_2$ ions for selectively forming a P-type channel stopper 142 are selectively implanted into a portion near the P-type semiconductor substrate 102 surface, for example, after which an element isolation insulating film 130 and the P-type channel stopper 142 are selectively formed by using a LOCOS method etc. (FIG. 7). In the case of forming the element isolation oxide film using the LOCOS method, the thermal oxidation step is such that plural (about 150) large-diameter wafers are simultaneously processed at high temperature and high oxidation rate for a long time.

4. Channel Doping

Figure 8:
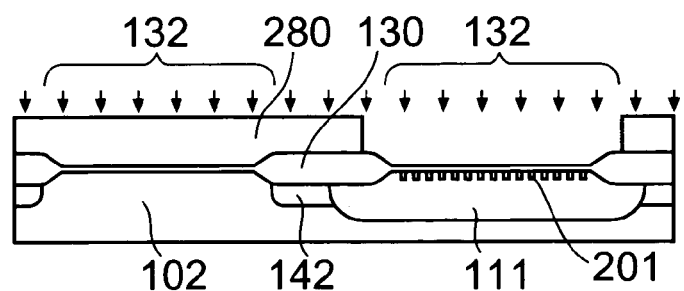
FIG. 8 is a sectional view illustrative of a typical manufacturing method for a semiconductor device used in an embodiment of the present invention in the step order.

Phosphorous, As, B, or $BF_2$ ions for controlling a threshold voltage are selectively implanted into the semiconductor substrate surface in an active region 132 for element formation where a MOS transistor is formed later, for example, to thereby form an impurity doped region 201. In some cases, as a region corresponding to the impurity doped region 201, plural regions may be separately formed according to need, e.g., according to a conductivity type of the MOS transistor, and the threshold voltage. Some specifications of the semiconductor device may impose too narrow tolerance on an ion implantation amount etc. (FIG. 8). Even if a channel doping step M and its subsequent step, a gate oxide film step N are carried out in reverse order, the same semiconductor device can be obtained.

5. Gate Oxide Film

Figure 9:
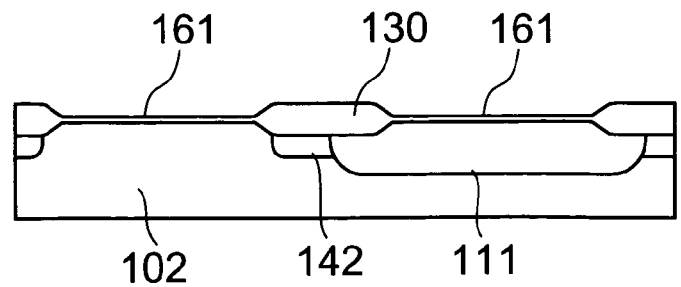
FIG. 9 is a sectional view illustrative of a typical manufacturing method for a semiconductor device used in an embodiment of the present invention in the step order.

An oxide film near the semiconductor substrate surface in the active region 132 for element formation is removed to form a gate oxide film 161 through thermal oxidation etc. (FIG. 9). Here, the thickness of the gate oxide film 161 is arbitrarily set according to the specifications of the semiconductor device, but is an important process parameter for determining a threshold voltage of the MOS transistor. After that (after the formation of the gate oxide film. 161), phosphorous, B, or $BF_2$ ions for controlling a threshold voltage may be selectively implanted, for example, into the semiconductor substrate surface in the active region 132 for element formation where the MOS transistor is formed later to thereby form the impurity doped region 201 as shown in FIG. 8.

6. Polysilicon

Figure 10:
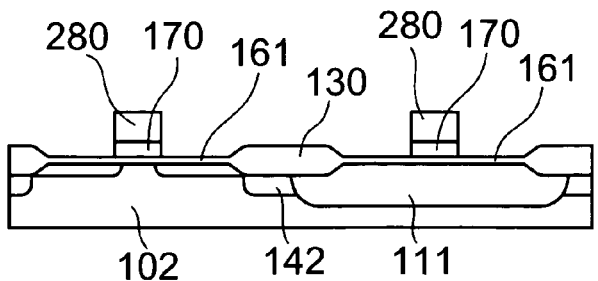
FIG. 10 is a sectional view illustrative of a typical manufacturing method for a semiconductor device used in an embodiment of the present invention in the step order.

A polysilicon gate 170 is selectively formed on the gate oxide film 161 through CVD, photolithography, or etching (FIG. 10). Here, a process width of the polysilicon gate 170 is arbitrarily set according to the specifications of the semiconductor device, but is an important process parameter for determining a drive power of the MOS transistor. Also, after that, although not shown here, the oxide film is formed and then a second polysilicon layer for resistor may be formed.

7. Source/drain Formation

Figure 11:
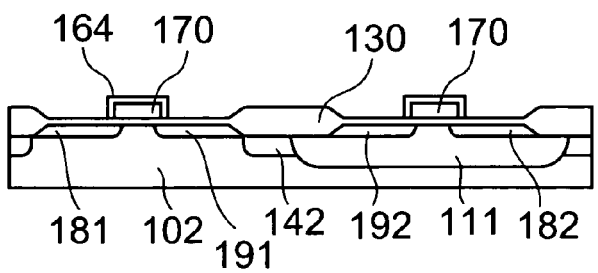
FIG. 11 is a sectional view illustrative of a typical manufacturing method for a semiconductor device used in an embodiment of the present invention in the step order.
Figure 19:
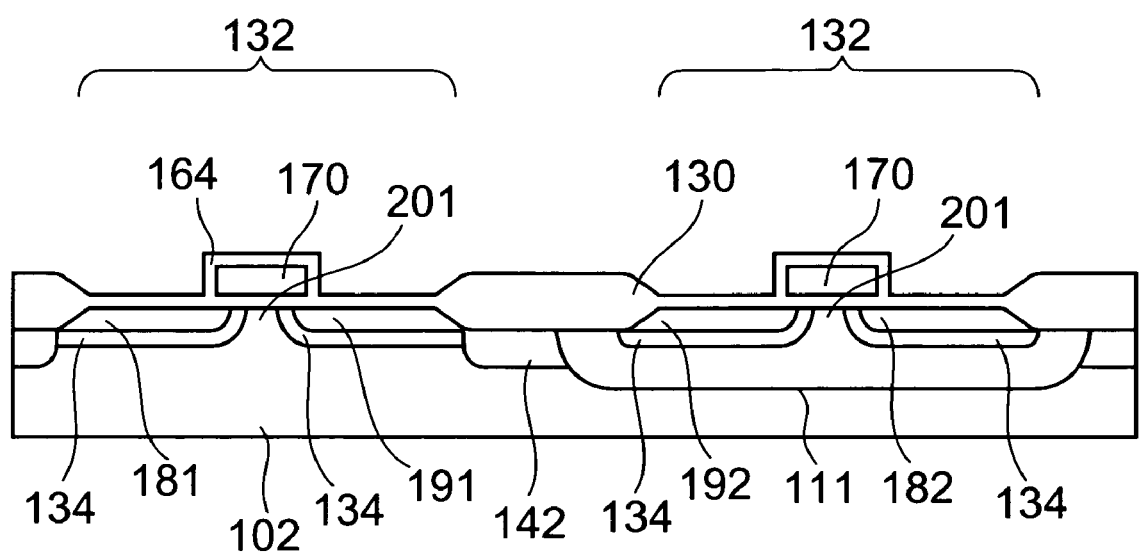
FIG. 19 is a sectional view illustrative of a typical DDD process used in an embodiment of the present invention in the step order.

After an oxide film 164 is formed on the P-type semiconductor substrate 102 surface by CVD or thermal oxidation, phosphorous, As, B, or $BF_2$ ions for forming source/drain regions are implanted to the polysilicon gate 170 and the oxide film 164 in desired regions of the active region 132 for element formation in a self-alignment manner, for example, to thereby form an N-type source region 181, an N-type drain region 191, a P-type source region 182, and a P-type drain region 192 (FIG. 11). Here, the source region and drain region may each have a low-concentration impurity region called "lightly doped drain (LDD)" and a low-concentration impurity region called "double diffused drain" (DDD) and formed by diffusing impurities in a nitrogen or diluted oxygen atmosphere at about 900 to 1,100° C. The source/drain regions may have a low-concentration impurity region 134 formed by thermally diffusing impurities doped through ion implantation before forming the source/drain regions in a source/drain formation step P, at about 900 to 1,100° C. in a nitrogen or diluted oxygen atmosphere (FIG. 19). This step is hereinafter referred to as a DDD step.

8. Interlayer Insulating Film

Figure 12:
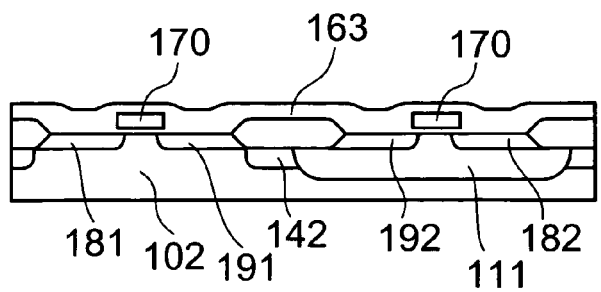
FIG. 12 is a sectional view illustrative of a typical manufacturing method for a semiconductor device used in an embodiment of the present invention in the step order.

An oxide film is deposited on the P-type semiconductor substrate 102 surface by CVD or the like and annealed at about 800 to 900° C. in a nitrogen or diluted oxygen atmosphere to thereby form an interlayer insulating film 163 (FIG. 12).

9. Contact Hole, Metal Wiring, and Protective Film

Figure 13:
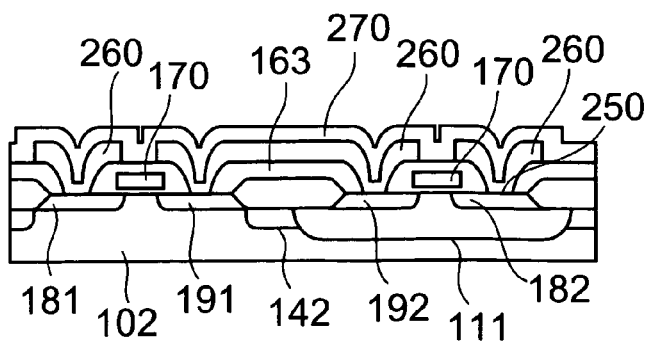
FIG. 13 is a sectional view illustrative of a typical manufacturing method for a semiconductor device used in an embodiment of the present invention in the step order.
Figure 14:
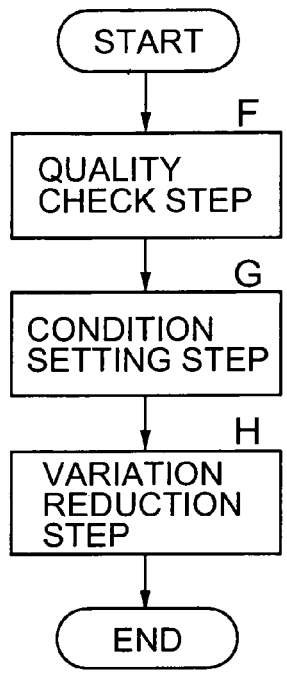
FIG. 14 is a conceptual view of a manufacturing process flow for absorbing variations in electric characteristics in a conventional manufacturing method for a semiconductor device.
Figure 15:
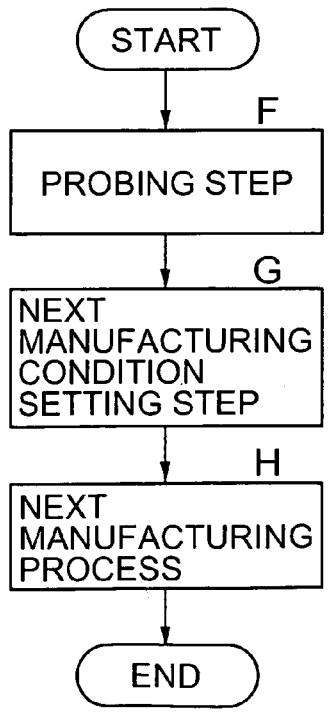
FIG. 15 is a flowchart illustrative of a manufacturing process flow for absorbing variations in electric characteristics in a manufacturing method for a semiconductor device of Prior Art 1 (first prior art)
Figure 16:
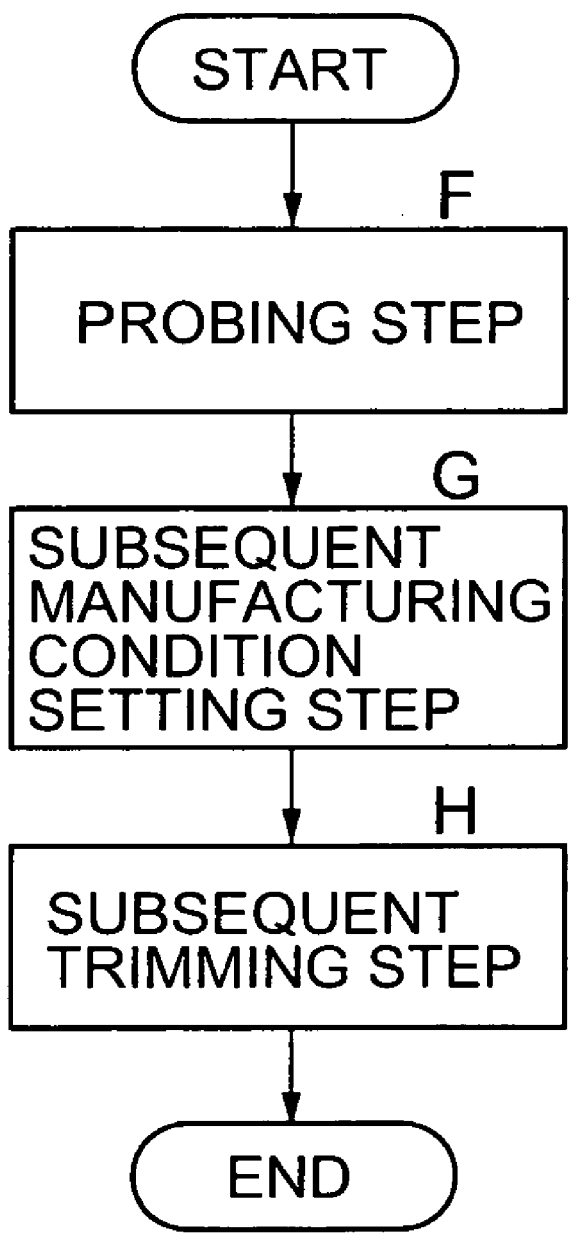
FIG. 16 is a flowchart illustrative of a manufacturing process flow for absorbing variations in electric characteristics in a manufacturing method for a semiconductor device of Prior Art 2 (second prior art)
Figure 17:
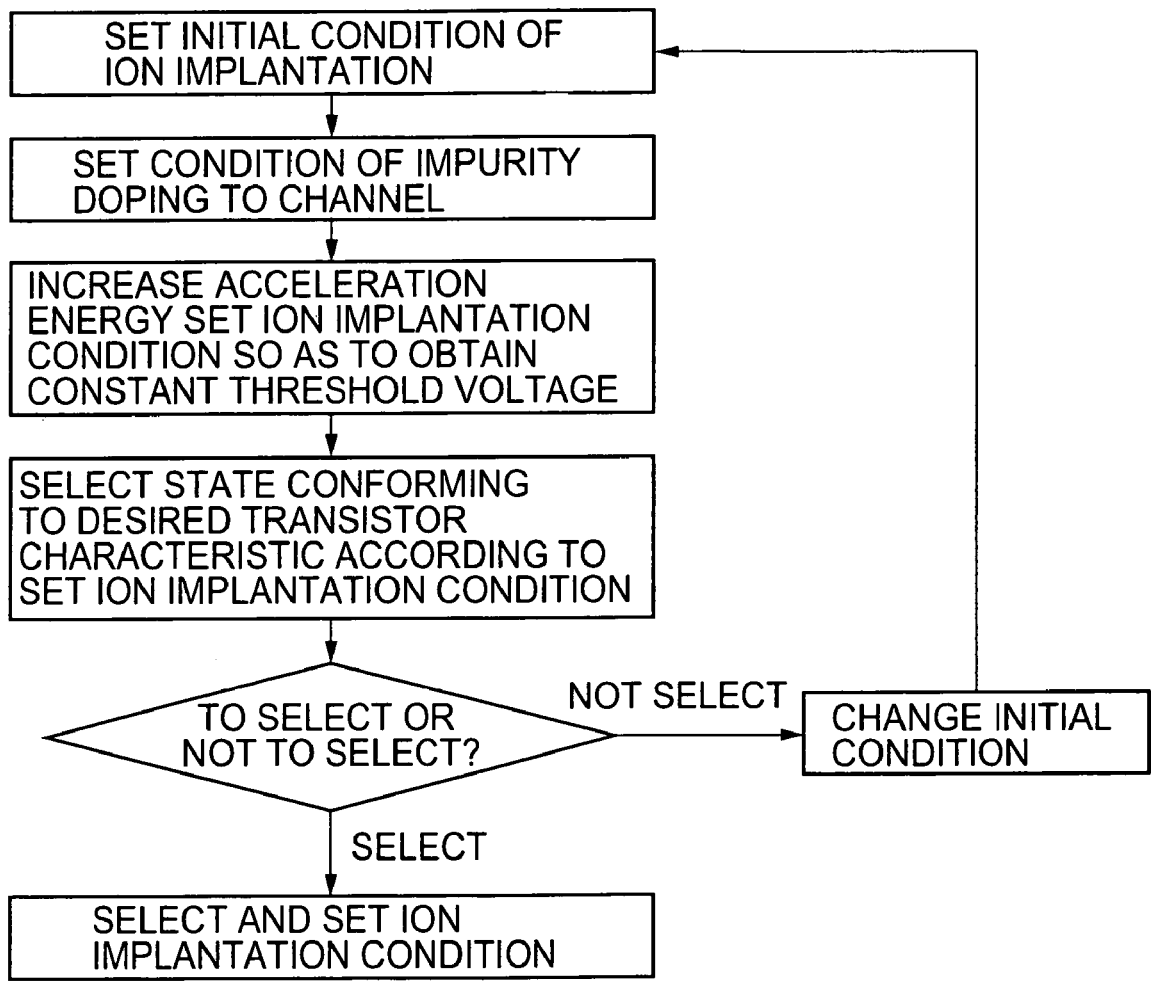
FIG. 17 is a flowchart illustrative of a flow for determining manufacturing conditions used for a feed-back applied manufacturing method of Prior Art 1.
Figure 18:
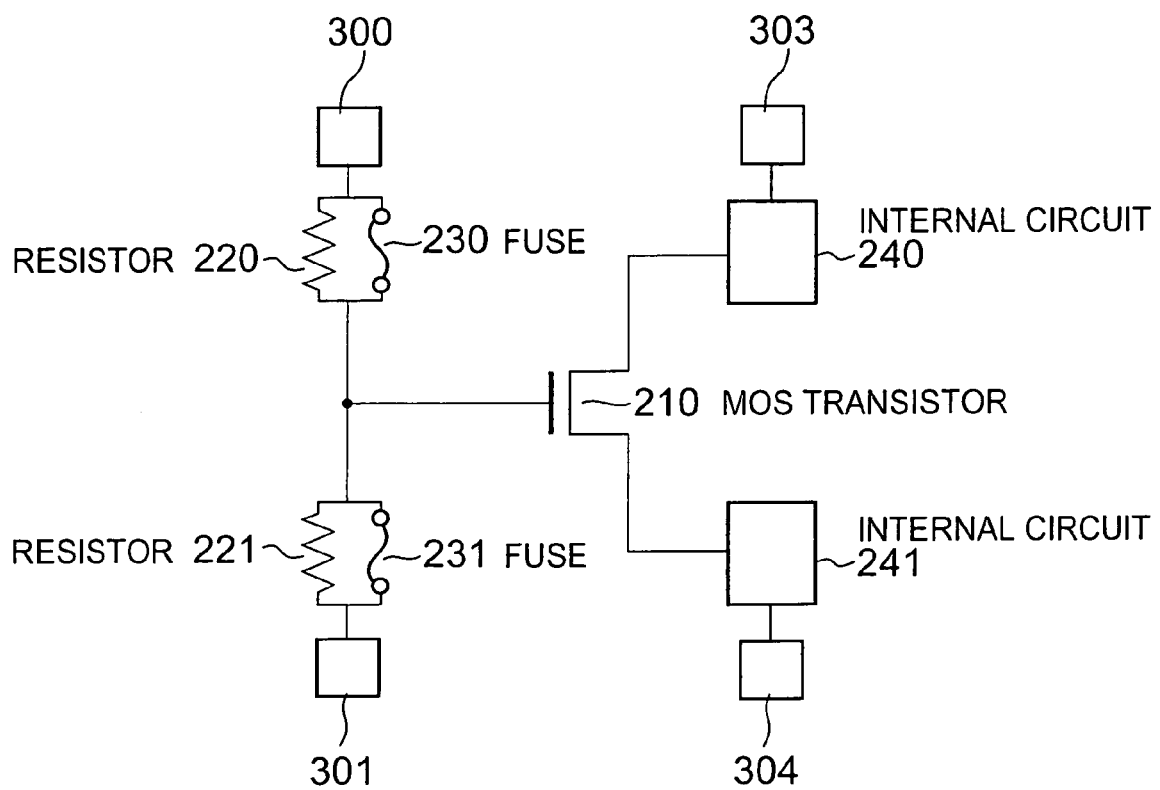
FIG. 18 is a schematic circuit diagram showing a trimming circuit used for a trimming applied manufacturing method of Prior Art 2.

A contact hole 250 is selectively formed in a desired region of the interlayer insulating film 163 by photolithography or etching, and the contact hole is made smooth through wet etching, reflow technique, or the like. A metal wiring 260 is selectively formed through sputtering, photolithography, etching, or the like. A protective film 270 is deposited by CVD etc. and an opening is selectively formed in a desired region (in an external connection terminal region or the like). Here, the case of forming the single-layer metal wiring 260 is described, but plural layers may be laminated through an interlayer insulating film as the metal wiring. Also, the metal wiring maybe formed such that barrier metal forms a lower layer thereof and an antireflection film forms an upper layer. In addition, an annealing step for recovery from process damage may be carried out in a hydrogen atmosphere at 350 to 450° C. (FIG. 13).

First Embodiment

The monitor wafer manufacturing process Z as a feature of the present invention includes: a monitor wafer pre-process step (FIG. 1, Step A); a step of copying characteristics of a main body wafer by simultaneously processing the main body wafer and monitor wafer (FIG. 1, Step C); a monitor post-process step for the monitor element 200 (FIG. 1, Step E); a step of measuring characteristics of the monitor element 200 (FIG. 1, Step F); and a step of setting manufacturing conditions in the variation reduction step H (FIG. 1, Step G). Here, the monitoring step C of copying the quality of the half-completed main body wafer on the monitor wafer aims at simultaneously processing the main body wafer and the monitor wafer in the same apparatus. In this embodiment, a MOS diode shown in FIG. 4 is used as the monitor element 200 where the quality of the half-completed semiconductor device is copied in the monitoring step C. Hereinafter, an embodiment of the feed-forward type manufacturing method according to the present invention will be described in detail centering on a monitor wafer manufacturing process Z.

1. Monitor Pre-process Step

The P-type semiconductor substrate 102 having the same concentration as that for the main body wafer is used as a monitor wafer. The manufacturing process for the monitor wafer preceding the monitoring step C is preferably simpler than the manufacturing process for the main body wafer preceding the monitoring step C. To elaborate, N-type impurities necessary for forming an N well (forming a low-concentration impurity region) are doped into the monitor wafer under the same conditions as those for an N well formation step K for the main body wafer. A monitor pre-process step A of this embodiment is different from the main body pre-process step B in that the field oxide film step J is omitted. The monitor pre-process step A is preferably a simple and short-term process in terms of cost performance (FIG. 1, Step A).

2. Monitoring Step

Figure 23:
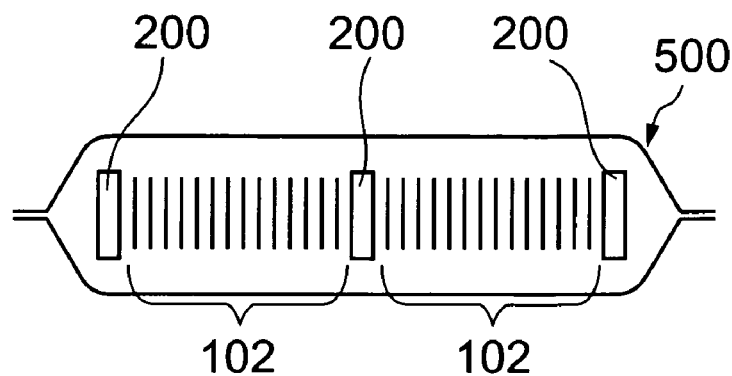
FIG. 23 is a schematic diagram showing how P-type semiconductor substrates (main body wafers) and monitor elements (monitor wafers) are placed in an oxidation furnace tube in a monitoring step used in an embodiment of the present invention.

The monitoring step C is important as a step of copying a quality of the half-completed main body wafer on the monitor wafer. In short, this is a step of accurately copying on the monitor wafer a process influence (monitor condition) by which the parameter having a high rate of contribution that influences the quality of the completed semiconductor device can be estimated. In this embodiment, a well thermal diffusion step in the N well formation step K involving the large production variations is used as the monitoring step C. In the well thermal diffusion step, plural (about 150) large-diameter wafers are simultaneously processed in line at high temperature of about 1,100 to 1,200° C. for a long time. As a result, a difference in thermal history is caused between wafers or in a wafer. This step is more likely to cause large production variations. The production variations appear as variations in well diffusion depth. An impurity concentration profile varies and upon the completion of the pre-manufacturing process X, the variations are obviously observed as variations in the threshold voltage Vt of the MOS transistor. The monitor wafer and the main body wafer having undergone the main body pre-process step B are simultaneously processed. Simultaneous processing is only intended to more accurately copy the process influence, so if the processing conditions are the same between the main body wafer and the monitor wafer, simultaneous processing for the main body wafer and the monitor wafer is not the requisite for the present invention. This concerns a copy accuracy. In order to more accurately copy the process influence, simultaneous processing is preferred. Similarly, the monitor wafer is determined for an insertion position and the number of wafers to be inserted in consideration of correlation between a variation tolerance and a variation range of the gate oxide film formation step (FIG. 1, Step C). As shown in FIG. 23, provided that a horizontal diffusion furnace is used, inserting monitor elements 500 in a furnace at about three positions, i.e., position around the center and both ends makes it possible to estimate which position in the furnace a main body wafer 400 involving an abnormality is processed in.

In general, taking into consideration the fact that the main body wafers are fed one after another and transferred on production lines, it is preferable to prepare a monitor wafer that has been finished up to a step preceding the monitoring step. Further, it is desirable to provide a system using a computer storing numbers etc. of the semiconductor device and the monitor element so as to correlate the main body wafer placed in a predetermined position in the diffusion furnace and the monitor element (as described in detail later).

3. Monitor Post-process Step

In the monitor wafer, the polysilicon gate 170 as a gate electrode is formed on the gate insulating film 161 as shown in FIG. 4 so as to realize electric measurement thereafter. Further, the metal wiring 260 may be connected onto the polysilicon gate 170 for lowering a contact resistance between a probe of a measuring device and the monitor element 200 upon measurement.

In the monitor post-process step (FIG. 1, Step E), main high-temperature heat treatment steps (e.g., DDD step) as described later except the N well thermal diffusion step necessary for the manufacturing process for the semiconductor device may be added by the well known method after the N well thermal diffusion step with a view to amplifying the monitor condition of the monitor wafer processed simultaneously with the main body wafer (FIG. 1, Step C) for high-sensitivity measurement. This aims at accurately measuring the process influence of the main body wafer. After that, phosphorous is doped into the monitor wafer surface in an amount of impurity A corresponding to a concentration of $9.0 \times 10^{11}/cm^2$ in order to form the low-concentration impurity region 134, which corresponds to the channel doping step M for the main body wafer, for example. Thereafter, the polysilicon gate 170 as the gate electrode is formed on the gate insulating film 161. Further, the metal wiring 260 may be connected onto the polysilicon gate 170 for lowering the contact resistance between the probe of a measuring device and the monitor element 200 upon measurement. In this case, the polysilicon gate 170 is used to form the gate electrode, but the metal wiring 260, for example, aluminum silicon may be used therefor (FIG. 1, Step E).

The thermal histories of the gate oxide film formation step N of the semiconductor device of the main body wafer and its subsequent main high-temperature heat treatment steps supposedly involve the following six steps of:

(1) forming the polysilicon gate 170 (by CVD or the like);
(2) forming the oxide film 164 (by CVD or thermal oxidation);
(3) forming low-concentration impurity regions (through diffusion in a nitrogen or diluted oxygen atmosphere at about 900 to 1,100° C. in the case of using the DDD structure);
(4) forming the interlayer insulating film 163 (by depositing the oxide film by CVD or the like, followed by annealing in a diluted oxygen atmosphere at about 800 to 900° C.);
(5) forming a smooth contact hole (in the case of molding with a reflow technique); and
(6) promoting recovery from a process damage (annealing step at 350 to 450° C. in a hydrogen atmosphere).

The term "approximating the thermal histories of the gate oxide film step N of the semiconductor substrate of the main body wafer and its subsequent steps" means "equalizing the histories of maximum temperature and processing time in the step (3) requiring the long-term heat treatment at the highest temperature among the steps requiring heat treatment at a relatively high temperature. Note that plural steps requiring particularly high temperatures may be selected. This is because the impurity diffusion largely and mainly depends on temperature.

4. Quality Check Step

Next, the process influence of the monitor element 200 is checked (Step F). In this embodiment, the variations in impurity concentration profile of the impurity doped region 201 are derived from capacitance-voltage (CV) characteristics of the monitor element 200 of the monitor wafer to obtain information on measurements of the threshold voltage Vt or flat band voltage Vf. It is preferable at this time to measure the distribution in the main body wafer as well. Measuring items in this case may include the thickness of the oxide film on the monitor element 200 surface in addition to the CV characteristics. Alternatively, the concentration in the substrate surface may be directly measured (FIG. 1, Step F).

5. Characteristic Estimation Step

Figure 20A:
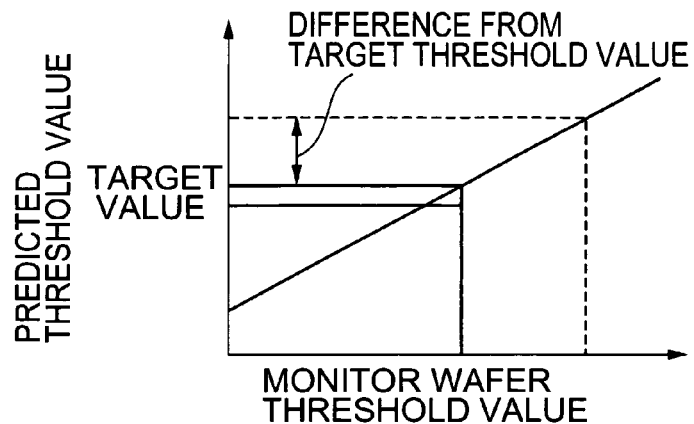
FIGS. 20A to 20C are characteristic graphs prepared for determining an impurity dose according to an embodiment of the present invention.

The threshold voltage Vt is predicted from the threshold voltage Vt calculated from a capacitance value of the monitor wafer measured by the CV method. At this point, it is preferable to measure the distribution in the main body wafer as well. For example, assume that the target threshold voltage Vt of the PMOS transistor formed in the N well 111 is −0.8 V and the threshold voltage Vt of the PMOS transistor calculated from the measurements of the monitor wafer by the CV method is −0.75 V. In this case, a gate oxide film thickness tox of the semiconductor devices mounted in great numbers on each wafer and the impurity concentration profile are estimated from the measurement information. Based on a correlation between the known threshold voltage Vt of the monitor wafer and the threshold voltage Vt of the transistor formed on the main body wafer (FIG. 20A), the estimation information for estimating the threshold voltage Vt of the main body wafer is created (FIG. 1, Step G1).

6. Condition Setting Step

Figure 20B:
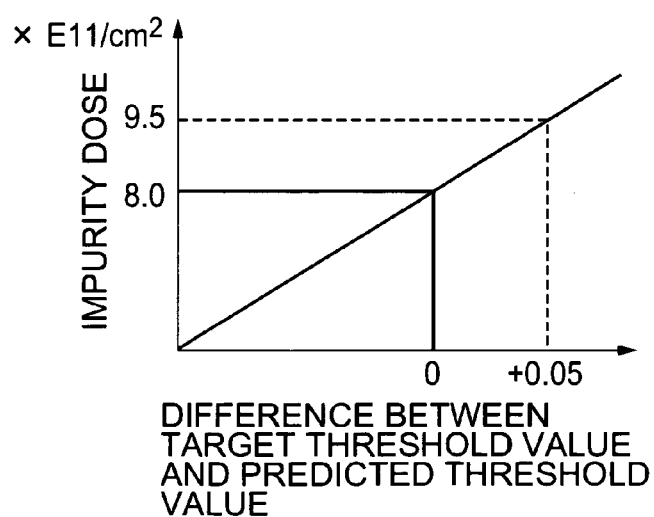

In this embodiment, the channel doping step M out of the main body post-process steps D is selected as the variation reduction step H. According to the estimation information, the ion implantation conditions in the channel doping step M is determined in an analog fashion so as to sufficiently reduce the variations in the threshold voltage Vt. In the first embodiment, an amount of impurities to be doped to form the impurity doped region 201 on the P-type semiconductor substrate 102 is calculated such that the threshold voltage Vt of the PMOS transistor reaches −0.8V. As a result, an amount of impurity 10% higher in concentration than the monitor wafer is defined as an amount of impurity to be doped to form the impurity doped region 201 (FIG. 20B).

At this point, it is preferable to measure the distribution in the main body wafer as well. The way to realize the threshold value of the PMOS transistor with higher precision will be described in detail. This is a method of estimating an in-plane distribution of the P-type semiconductor substrate 102 by measuring, in the thermal diffusion step, a distribution in the monitor wafer closest to the P-type semiconductor substrate 102. Increasing the number of monitor wafers to be inserted enables estimation of the threshold value with higher precision. Based on the estimated threshold value, the conditions of the impurity to be doped to form the impurity doped region 201 in the P-type semiconductor substrate 102 are set for each region in the wafer for manufacturing the semiconductor device, so the desired threshold value of the PMOS transistor can be obtained.

Figure 22:
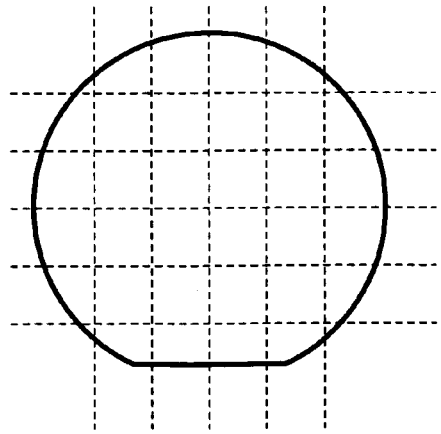
FIG. 22 is a conceptual view of a threshold voltage distribution of a transistor in a main body wafer, which is estimated in an embodiment of the present invention.

A method of determining an impurity amount for each region in the wafer for manufacturing the semiconductor device is specifically shown in figures. As shown in FIG. 22, for example, the monitor wafer surface is divided as indicated by the broken lines in order to grasp a distribution in the monitor wafer. The regions divided along the broken lines are each subjected to CV measurement to obtain the electric characteristics and average values thereof are calculated for each region. The average values are used to profile the distribution in the wafer. Based on the distribution in the monitor wafer, the distribution in the wafer for manufacturing the semiconductor device is estimated referring to FIGS. 20A and 20B to set the impurity dose for each region. The set value is reflected in an ion implantation map.

Herein, the distribution due to the heat treatment is a main factor and hence threshold value distribution is supposed to appear in the outer periphery and the center of the wafer. In setting the ion implantation conditions in this case, a method of rotating the wafer and finely adjusting the implantation time between the outer periphery and the center is effective. The adjustment of the implantation time can be realized by setting an implantation map of an ion implantation device. Also, the implantation level of the outer periphery and center can be set by finely adjusting the ion beam focus (spot).

For example, the target threshold value of the PMOSFET in the N well 111 on the P-type semiconductor substrate 102 is set to −0.8V. At this time, threshold values at the center and outer periphery of the wafer for manufacturing the semiconductor device of the PMOSFET in the N well 111 on the P-type semiconductor substrate 102, which are calculated from electric characteristics of the monitor wafer into which phosphorous is doped in a concentration of $9.0 \times 10^{11}$/cm$^2$ are set to −0.8 V and −0.78 V, respectively. Based on the results, the ion implantation time to the outer periphery is set longer so that an impurity is doped into a channel formation region 150 on the P-type semiconductor substrate 102 at the outer periphery in a concentration several % higher than that of the monitor wafer. Setting the impurity amount for each region in the wafer for manufacturing the semiconductor device offers a desired threshold value uniformly in the wafer.

Figure 20C:
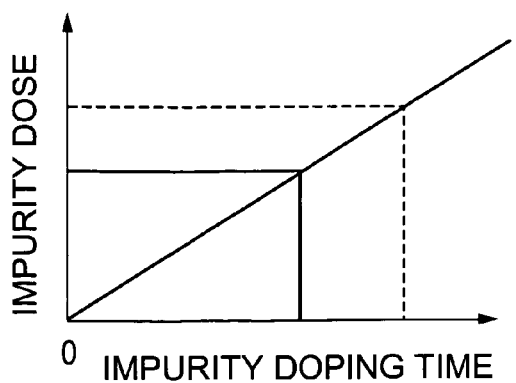
Figure 21:
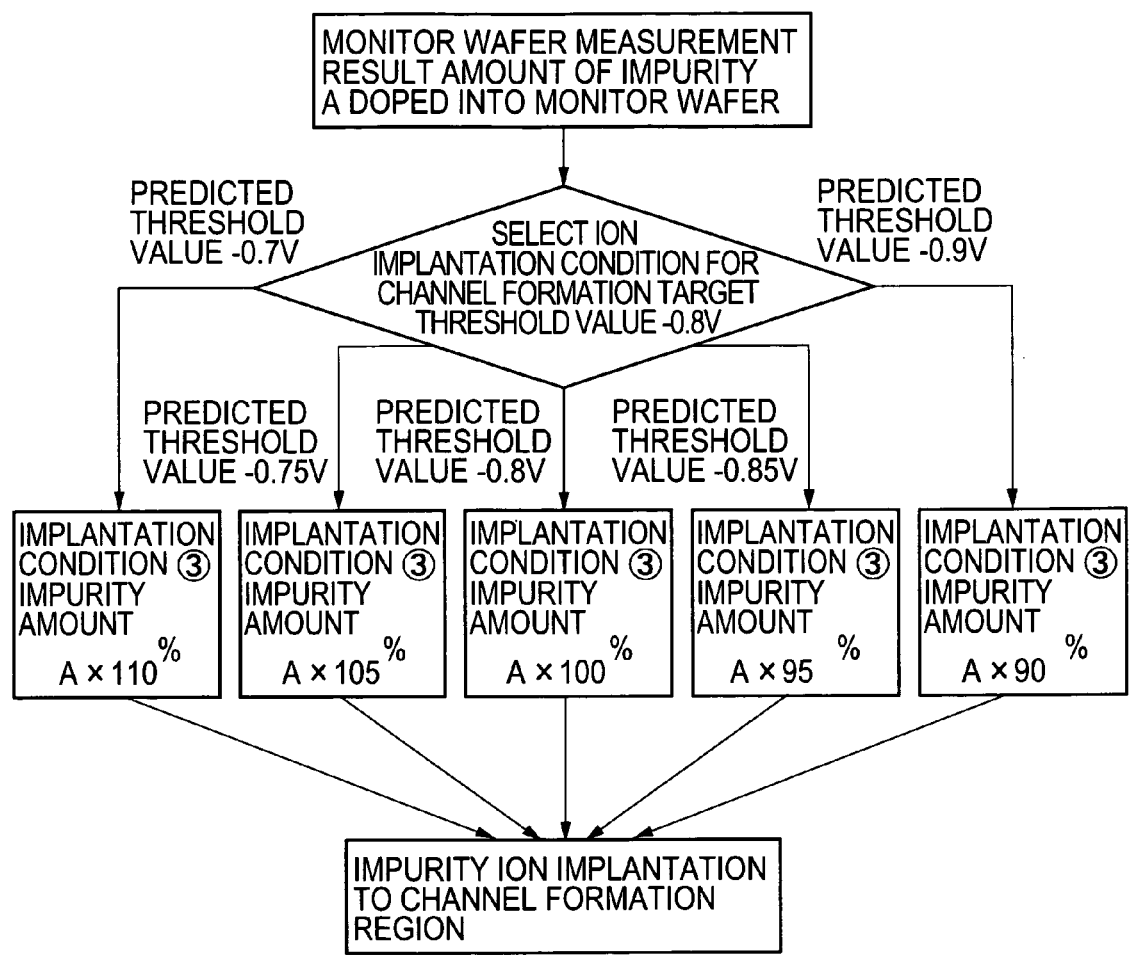
FIG. 21 is a flowchart illustrative of a flow used for determining an impurity dose according to an embodiment of the present invention.

According to the estimation information and installation position and number of monitor wafers, the ion implantation condition of the channel doping step M, for example, impurity doping time is determined for each wafer or every several wafers with reference to FIG. 20C (FIG. 1, Step G2).

7. Variation Reduction Step

In the first embodiment, the channel doping step M is set as the variation reduction step H. The main body wafer having undergone the monitoring step C is subjected to the channel doping process of the main body wafer for each wafer or every several wafers under the ion implantation condition determined in the condition setting step G2. At this time, if the channel doping process is executed along with the measurement of the distribution in the main body wafer, an effect of reducing variations in threshold voltage of the main body wafer is further enhanced; however, this is preferably determined in consideration of the cost of the semiconductor device to be manufactured (FIG. 1, Step H). Also, in this embodiment, the channel doping step M is set as the variation reduction step H. However, according to the main body wafer manufacturing process, the gate oxide film step N or the source/drain formation step P may be set as the variation reduction step H.

8. Subsequent Post-process Step

The main body wafer having undergone the variation reduction step H passes through the subsequent post-process steps including a wafer inspection step U and thus the pre-manufacturing process X ends.

Second Embodiment

In a second embodiment of the present invention, the DDD step in the source/drain formation step P is set as the variation reduction step H. The monitor pre-process step and the monitoring step are the same as the first embodiment. Based on the threshold voltage Vt of the semiconductor device estimated from measurements of the monitor element 200, the manufacturing condition of the variation reduction step H is determined. The DDD step in which the low-concentration diffusion regions 134 are formed for source/drain regions requires as low a processing temperature as 1,000 to 1,100° C. as compared with the well thermal diffusion step. Hence, variations in processing temperature are small and the processing temperature is easy to control. Therefore, it is suitable for implementing the present invention that the DDD step is selected as the variation reduction step H for controlling the threshold voltage of the semiconductor device and the processing temperature in the DDD step is selected as the manufacturing condition to be adjusted. Also, in the DDD step, the processing time may be selected as the manufacturing condition to be adjusted. The DDD step has an effect of not only diffusing impurities to form low-concentration impurity regions for the source/drain regions but also changing the concentration profile of the channel region. Adjusting the processing temperature or time yields a desired concentration profile of the channel region.

In this embodiment, the diffusion step (DDD step) is set as the variation reduction step H, but needless to say, the other main high-temperature heat treatment steps described in the first embodiment may be used to produce the same effects.

Third Embodiment

Figure 24:
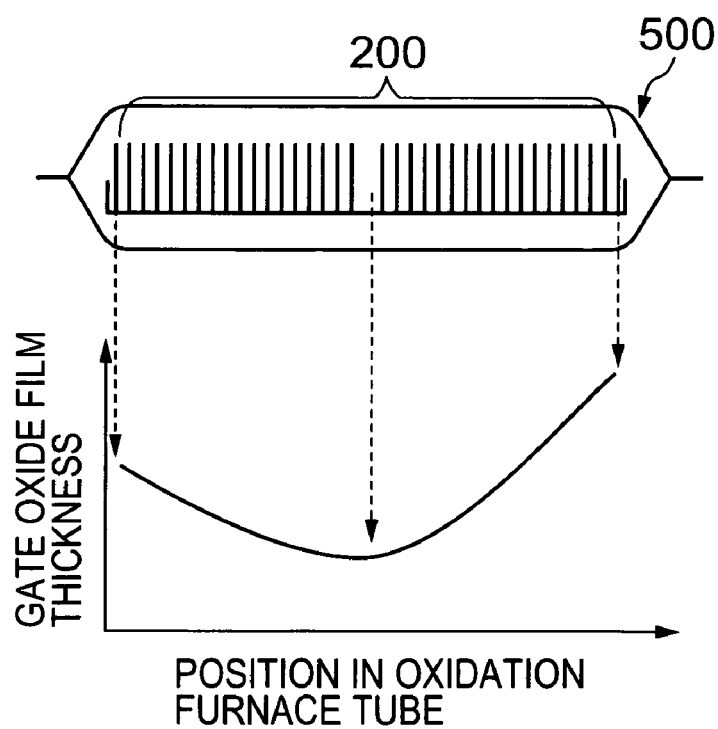
FIG. 24 is a schematic diagram showing how monitor elements (monitor wafers) are set in an oxidation furnace tube in a monitoring step used in an embodiment of the present invention.
Figure 25:
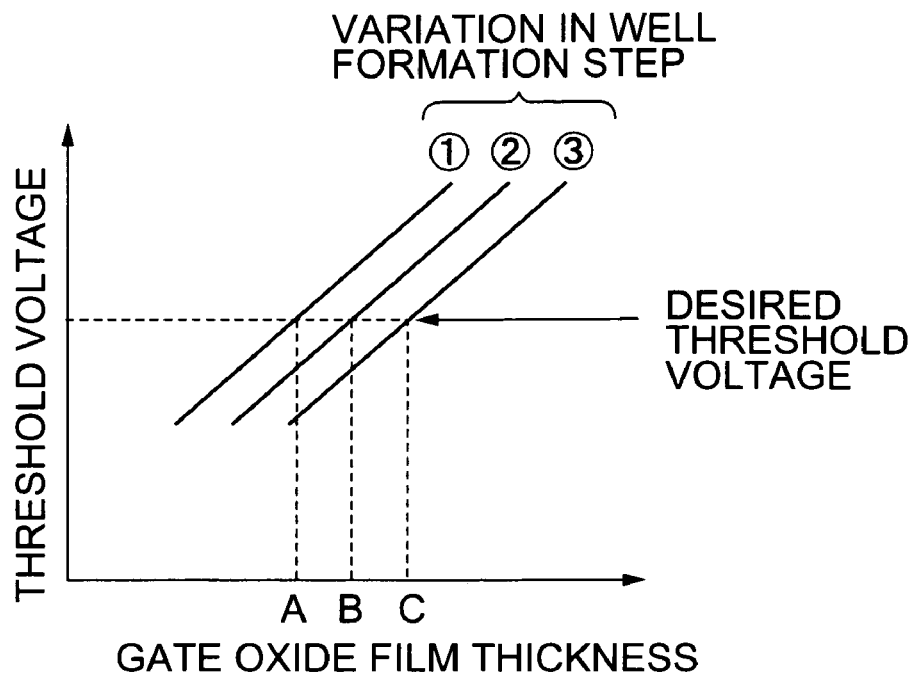
FIG. 25 is a conceptual view of a method of reducing variations in threshold voltage, which are caused in a well formation step, at a gate oxide film formation step according to an embodiment of the present invention.
Figure 26:
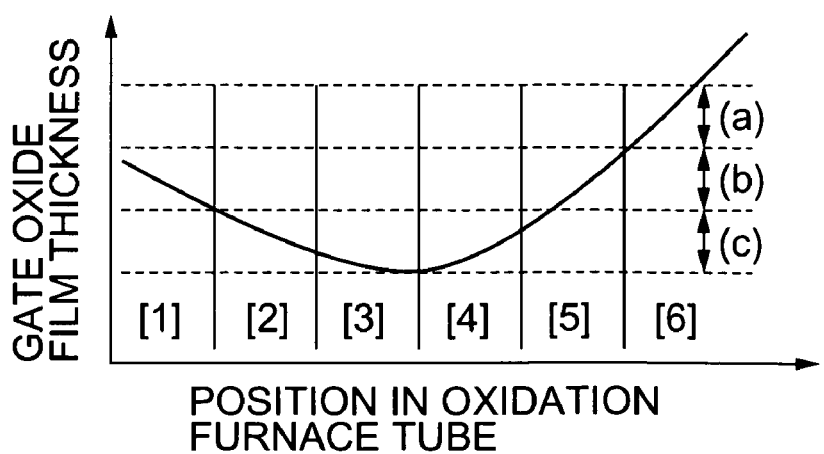
FIG. 26 illustrates a method of placing a wafer in an oxidation furnace for reducing variations of threshold voltage, which are caused in a well formation step, at a gate oxide film formation step according to an embodiment of the present invention.

In a third embodiment of the present invention, the gate oxide film formation step N is set as the variation reduction step H. FIG. 25 illustrates a specific example of embodying a method of adjusting the threshold voltage Vt of the semiconductor device according to the gate oxide film thickness tox in the gate oxide film formation step N. Before the manufacturing method of the present invention is applied, it is necessary to grasp the thickness profile of the gate oxide film thickness tox according to a position in an oxidation furnace tube to be used (FIG. 24). The monitor element 200 structured as shown in FIG. 4 is used and the gate oxide film thickness tox is calculated from the electric characteristics of the monitor element 200, so a distribution of the gate oxide film thickness tox in the oxidation furnace tube can be grasped more precisely. Also, it is necessary to examine the correlation between the gate oxide film of the semiconductor device and the threshold voltage. The correlation between the gate oxide film thickness tox and the threshold voltage Vt can be derived from a theoretical equation for the threshold voltage Vt. To attain higher precision, the threshold voltage Vt upon actually changing the gate oxide film thickness tox of the semiconductor device is preferably measured to derive the correlation from the measurements. As shown in FIG. 25, it is assumed that variations in the threshold voltage Vt in the well diffusion step are caused as indicated by (1), (2), and (3) based on predicted values from the monitor element 200. The correlation between the gate oxide film thickness tox and the threshold voltage Vt in the case of (2) is defined as ideal characteristics and the gate oxide film thickness tox that enables the desired threshold voltage Vt at this time is defined as a film thickness B. The manufacturing condition for the gate oxide film formation step is set such that the gate oxide film thickness tox in a region (b) of FIG. 26 equalizes the film thickness B. If represented by positions in the oxidation furnace, the film thickness corresponds to positions [1] and [5] as shown in FIG. 26. When the predicted threshold voltage Vt corresponds to the case of (1), the threshold voltage Vt is higher than that of the ideal case of (2). Hence, the gate oxide film should be formed with a thickness smaller than the film thickness B in order to obtain the desired threshold voltage Vt. Accordingly, as shown in FIG. 25, the gate oxide film is set to a film thickness A. For setting the gate oxide film thickness tox smaller than the film thickness B, the gate oxide film thickness tox corresponds to a region (c) of FIG. 26, so processing is carried out in positions [2], [3], and [4] in the oxidation furnace. When the predicted threshold voltage Vt corresponds to the case of (3), the threshold voltage Vt is lower than that of the ideal case of (2). Hence, it is necessary to set the gate oxide film thickness tox larger than the film thickness B for obtaining the desired threshold voltage Vt. Accordingly, the film thickness is set to a film thickness C as shown in FIG. 25. For setting the gate oxide film thickness tox larger than the film thickness B, the gate oxide film thickness tox corresponds to a region (a) of FIG. 26, so processing is carried out in a position [6] in the oxidation furnace.

In the description of this embodiment, an area in furnace is divided into six regions by way of example, but the more the divided regions, the higher the precision of this adjusting method. In this embodiment, the horizontal oxidation furnace is taken as an example. However, the above method is applied to devices in different forms such as a vertical oxidation furnace, making it possible to reduce the variations.

As understood from the above description, the monitoring step C is a step of accurately copying a quality of the main body wafer on the monitor wafer. Note that the wafer pre-process step A and the monitor post-process step E need to be steps of forming the monitor element 200 such that the copied quality variation is amplified and measured.

In the embodiment, the concentration of the substrate for use in the monitor wafer is set equal to the concentration of the substrate for use in the main body wafer; some of the characteristics to be measured may rather increase a sensitivity to monitoring by lowering the concentration of the substrate by about 10 to 50% and some characteristics can be monitored more precisely with a high substrate concentration rather than a low substrate concentration. Thus, it is necessary to select a substrate concentration by which the characteristics can be measured most accurately according to the target characteristics.

Further, in the description of the embodiment, the step causing the variations is set to the well thermal diffusion step in the N well step K. The present invention is applicable to, based on the same idea, the LOCOS step L, the polysilicon gate step O, the channel doping step M, the source/drain formation step P including the DDD step, and various etching steps, which cause the variations in electric characteristics of the semiconductor device, as the monitoring step C. Also, in the description of the first embodiment, the second embodiment, and the third embodiment, the variation reduction step H is set as the channel doping step M, as the diffusion step (DDD step), and as the gate oxide film formation step, respectively. However, the interlayer insulating film formation step Q, the protective film formation step T, etc. may be set as the variation reduction step H. The monitoring step C or variation reduction step H may be selected in consideration of process characteristics. Also, the monitoring step C or variation reduction step H may be set in plural but is preferably set taking into account a cost.

Further, by checking the measurements of the monitor element 200 at regular intervals, it is possible to make sure whether parameters important in the N well step K (furnace temperature, furnace oxygen concentration, processing time, etc.) vary or not. Hence, it is possible to control the manufacturing device and the process flow used for oxidation/diffusion process step. If there is a variation in production parameter, the parameter can be adjusted. Of course, upon adjusting the production parameter, checking the variation of measurements of the monitor element 200 conforms which production parameter needs to be adjusted and how far the parameter needs to be adjusted. Also, the present invention is applicable to the step causing the damage and the damage recovery step in the manufacturing process.

The present invention is directed to applications to manufacture of typical semiconductor devices and thus is applicable in a wide field of applications. For example, when the present invention is applied to manufacture of a semiconductor device including both a MOS transistor requiring a high-voltage operation and a MOS transistor requiring a low-voltage low-current operation, more specifically, a power management semiconductor device that controls charge/discharge of a lithium-ion battery, an effect of the present invention that realizes a semiconductor device with high quality and low cost can be exerted fully. However, needless to say, the present invention is not limited thereto.

What is claimed is:

1. A manufacturing method for a semiconductor device, comprising the steps of:
   selecting as a monitoring step, one step from a plurality of steps in a main body wafer manufacturing process for manufacturing a main body wafer on which the semiconductor device is formed, the monitoring step comprising a well thermal diffusion step in a well formation step;
   selecting as a variation reduction step, one step from main body post-process steps succeeding the monitoring step;
   a monitor wafer manufacturing process for manufacturing a monitor wafer on which a monitor element is formed, the monitor wafer manufacturing process comprising a monitor pre-process step, the monitoring step, a monitor post-process step, a quality check step of measuring a characteristic of the monitor element, and a condition setting step of setting a manufacturing condition in the variation reduction step based on a process influence measured in the quality check step; and
   performing the main body post-process step under the manufacturing condition set in the condition setting step.

2. A manufacturing method for a semiconductor device according to claim 1; wherein in the monitoring step, the main body wafer and the monitor wafer are simultaneously processed.

3. A manufacturing method for a semiconductor device according to claims 1 or 2; wherein the quality check step comprises the step of measuring a capacitance-voltage (CV) characteristic of the monitor element.

4. A manufacturing method for a semiconductor device according to claims 1 or 2; wherein the condition setting step includes a characteristic estimation step of estimating a threshold voltage of a transistor formed on the main body wafer and a condition setting step of setting a manufacturing condition of the main body post-process step.

5. A manufacturing method for a semiconductor device according to claims 1 or 2; wherein the variation reduction step comprises the step of doping an impurity in a channel region.

6. A manufacturing method for a semiconductor device according to claims 1 or 2; wherein the variation reduction step comprises an impurity diffusion step in a source/drain formation step.

7. A manufacturing method for a semiconductor device according to claims 1 or 2; wherein the variation reduction step comprises a gate oxide film formation step.

8. A manufacturing method for a semiconductor device according to claims 1 or 2; wherein the monitor pre-process step includes a step of forming a low-concentration impurity region having one of a first conductivity type and a second conductivity type on a surface of the monitor wafer.

9. A manufacturing method for a semiconductor device according to claims 1 or 2; wherein the monitor post-process step includes the step of forming a low-concentration impurity region on a surface of the monitor wafer.

10. A manufacturing method for a semiconductor device according to claims 1 or 2; further comprising a quality estimation step of estimating a quality of the semiconductor device in the main body wafer processed simultaneously with the monitor element in the well thermal diffusion step based on measurements of the monitor element.

11. A manufacturing method for a semiconductor device according to claims 1 or 2; wherein a manufacturing condition of the main body post-process step is changed when an electric characteristic of the semiconductor device in the main body wafer is predicted to vary based on measurements of the monitor element.

12. A manufacturing method for a semiconductor device according to claim 3; wherein the quality check step includes a step of measuring the CV characteristic of the monitor element; and wherein the quality estimation step includes a step of estimating a threshold voltage of a transistor of the main body wafer.

13. A manufacturing method for a semiconductor device according to claim 12; wherein the quality estimation step includes a step of estimating a distribution in the main body wafer of the threshold voltage of the transistor of the main body wafer.

14. A manufacturing method for a semiconductor device according claims 1 or 2; wherein the condition setting step includes the step of reflecting measurements of the monitor wafer and determining an impurity dose of a channel doping step as the variation reduction step.

15. A manufacturing method for a semiconductor device according to claim 14; wherein the steps of reflecting the measurements of the monitor wafer and determining the impurity dose of the channel doping step are performed in accordance with a distribution in the main body wafer.

16. A manufacturing method for a semiconductor device according to claim 11; further comprising a step of measuring a device characteristic by directly contacting a probe of a measuring device and a metal wiring without forming a protective film on the metal wiring.

17. A manufacturing method for a semiconductor device according to claims 1 or 2; wherein a manufacturing device used in the well thermal diffusion step is controlled based on measurements of the monitor element.

18. A manufacturing method for a semiconductor device, comprising the steps of:
  forming a main body wafer having a low concentration impurity region;
  providing a monitor wafer on which a monitor element is formed;
  copying onto the monitor element characteristics of the main body wafer by processing the main body wafer and the monitor wafer through thermal diffusion during formation of the low concentration impurity region of the main body wafer;
  measuring a characteristic of the monitor element by checking a process influence of the monitor element;
  setting manufacturing conditions in accordance with the process influence of the monitor element; and
  reducing variations in electric characteristics of the main body wafer in accordance with the set manufacturing conditions.

19. A manufacturing method for a semiconductor device according to claim 18; wherein the measuring step comprises measuring a capacitance-voltage characteristic of the monitor element.

20. A manufacturing method for a semiconductor device according to claim 18; wherein in the copying step, the main body wafer and the monitor wafer are simultaneously processed.

* * * * *